United States Patent [19]
Garofalo et al.

[11] Patent Number: 5,275,896
[45] Date of Patent: Jan. 4, 1994

[54] SINGLE-ALIGNMENT-LEVEL LITHOGRAPHIC TECHNIQUE FOR ACHIEVING SELF-ALIGNED FEATURES

[75] Inventors: Joseph G. Garofalo, South Orange; Robert L. Kostelak, Jr., Morris Plains; Christophe Pierrat; Sheila Vaidya, both of Watchung, all of N.J.

[73] Assignee: AT&T Bell Laboratories, Murray Hill, N.J.

[21] Appl. No.: 943,980

[22] Filed: Sep. 11, 1992

Related U.S. Application Data

[63] Continuation of Ser. No. 673,601, Mar. 21, 1991, abandoned, which is a continuation-in-part of Ser. No. 622,673, Dec. 5, 1990, abandoned.

[51] Int. Cl.$^5$ .......................... G03F 1/00; G03F 7/20; G03F 9/00
[52] U.S. Cl. .......................... 430/5; 430/296; 430/312; 430/313; 430/316; 430/317; 430/318; 430/323; 430/325; 430/328; 430/942
[58] Field of Search .................. 430/5, 22, 296, 312, 430/313, 316, 317, 318, 322, 323, 325, 328, 942

[56] References Cited

U.S. PATENT DOCUMENTS

| | | | |
|---|---|---|---|
| 3,930,857 | 1/1976 | Bendz et al. | 96/36.2 |
| 4,738,907 | 4/1988 | Shigetomi et al. | 430/5 |
| 4,751,170 | 6/1988 | Mimura et al. | 430/312 |
| 4,772,539 | 9/1988 | Gillespie | 430/296 |
| 4,985,374 | 1/1991 | Tsuji et al. | 430/312 |

FOREIGN PATENT DOCUMENTS 61-292643 12/1986 Japan .

OTHER PUBLICATIONS

Hinsberg, W. D. et al., "A Lithographic Analog of Color Photography: Self-Aligning Photolithography Using a Resist with Wavelength-Dependent Tone," *J. of Imaging Science*, vol. 33 (Jul./Aug. 1989) No. 4, Springfield, Va., pp. 129-135.

Flagello, D. et al., "A Single Expose Double Develop (SEED) Process for Self-Aligned Lithographic Applications," *8226 Microelectronic Engineering*, 9 (1989) May, pp. 47-52.

Nitayama, A. et al, *International Electron Device Meeting (IEDM) Technical Digest*, pp. 57-60 (3.3.1-3.3.4) Dec., 1989.

Levenson, M. D. et al, *IEEE Transactions on Electron Devices*, vol. ED-29, pp. 1828-1836 (1982).

Terasawa, T. et al., *SPIE*, vol. 1088, Optical/Laser Microlithography II (1989), pp. 25-33.

*Primary Examiner*—Marion E. McCamish
*Assistant Examiner*—Kathleen Duda
*Attorney, Agent, or Firm*—David I. Caplan

[57] ABSTRACT

A phase-shifting lithographic mask is made by a procedure involving only a single patterned electron, ion, or photon beam bombardment of a resist layer. The bombardment is arranged to produce three kinds of regions in the resist: no dosage, low dosage, and high dosage. These three regions in the resist are then utilized—in conjunction with an ordinary wet development step followed by either a silylation or an optical flooding technique, and thereafter by another ordinary wet development step—to pattern the resist layer and thereby to enable forming, by dry or wet etching, an underlying double layer consisting of a patterned opaque layer and a patterned transparent phase-shifting layer, the phase-shifting layer being located on, or being part of, a transparent substrate.

20 Claims, 4 Drawing Sheets

SINGLE-ALIGNMENT-LEVEL LITHOGRAPHIC TECHNIQUE FOR ACHIEVING SELF-ALIGNED FEATURES

This application is a continuation of application Ser. No. 07/673,601, filed on Mar. 21, 1991, now abandon, which is a continuation-in-part of application Ser. No. 07/622,673 filed Dec. 5, 1990, now abandoned.

TECHNICAL FIELD

This invention relates to optical lithography, such as used for the fabrication of semiconductor integated circuit and other devices, and more particularly to methods for making phase-shifting masks, for use in optical systems for lithographically fabricating such devices. These masks are also called "reticles" particularly when used in optical systems having magnifications different from unity.

BACKGROUND OF THE INVENTION

FIG. 1 shows a typical optical lithographic fabrication system 200 for delineating features in a wafer (substrate) 100 or in one or more layers of material(s) (not shown) located on a top major surface of the wafer, typically a semiconductor wafer (substrate). More specifically, optical radiation from an optical source 106, such as a mercury lamp, propagates through an aperture in an opaque screen 105, an optical collimating lens 104, a mask or reticle 103, and an optical focusing lens 102. The optical radiation emanating from the reticle 103 is focused by the lens 102 onto a photoresist layer 101 located on the top major surface of the wafer 100 itself or, alteratively, on the layer(s) on the top surface of the wafer 100. Thus, the pattern of the reticle 103—that is, its pattern of transparent and opaque portions—is focused on the photoresist layer 101. Depending upon whether this photoresist is positive or negative, when it is subjected to a developing process, typically a wet developer, the material of the photoresist is removed or remains at and only at areas where the optical radiation was incident. Thus, the pattern of the mask is transferred to ("printed on") the photoresist layer 101. Subsequent etching processes, such as wet etching or dry plasma etching, remove selected portions of the substrate or of the layer(s) of material(s) (not shown) located between the top major surface of the wafer and the bottom surface of the photoresist layer, or of both the substrate and the layer(s). Portions of the substrate or of the layer(s) of material thus are removed from the top surface of the wafer 100 at areas underlying where the photoresist layer 101 was removed by the developing process but not at areas underlying where the photoresist remains. Thus, the pattern of the mask 103 is transferred to the wafer 100 or to the layer(s) of material(s) overlying the wafer 100, as is desired, for example, in the art of semiconductor integrated circuit fabrication.

In fabricating such circuits, it is desirable to have as many devices, such as transistors, per wafer. Hence it is desirable to have as small a transistor or other feature size as possible, such as the feature size of a metallization stripe—i.e., its width W—or of an aperture in an insulating layer which is to be filled with metal, in order to form electrical connections, for example, between one level of metallization and another. Thus, for example, if it is desired to print the corresponding isolated feature having a width equal to W on the photoresist layer 101, a feature having a width equal to C must be located on the mask (reticle) 103. According to geometric optics, if this feature of width equal to C is a simple aperture in an opaque layer, then the ratio $W/C = m$, where $m = L2/L1$, and where $m$ is known as the lateral magnification. When diffraction effects become important, however, the edges of the image become fuzzy (lose their sharpness); hence the resolution of the mask features when focused on the photoresist layer deteriorates.

In a paper entitled "New Phase Shifting Mask with Self-Aligned Phase Shifters for a Quarter Micron Lithography" published in *International Electron Device Meeting (IEDM) Technical Digest*, pp. 57-60 (3.3.1-3.3.4) (December, 1989), A. Nitayama et al. taught the use of masks having transparent phase-shifting portions in an effort to achieve improved resolution—i.e., improved sharpness of the image of the mask features focused on the photoresist layer 101. More specifically, these masks contained suitably patterned transparent optical phase-shifting layers, i.e., layers having edges located at predetermined distances from the edges of the opaque portions of the mask. Each of these phase-shifting layers had a thickness t equal to $\lambda/2(n-1)$, where $\lambda$ is the wavelength of the optical radiation from the source 106 (FIG. 1) and n is the refractive index of the phase-shifting layers. Thus, as known in the art, these layers introduced phase shifts (delays) of $\pi$ radians in the optical radiation. By virtue of diffraction principles, the presence of these phase-shifting layers should produce the desired improved resolution. Such masks are called "phase-shifting" masks.

The mask structure described by A. Nitayama et al., op. cit., was manufactured by a single-alignment-level process involving a step of wet etching an opaque chromium layer located underneath a phase-shifting layer of PMMA which is resistant to the wet etching, whereby the etching of the chromium layer undercut the PMMA layer and formed a phase-shifting mask. However, the lateral etching of the chromium layer is difficult to control, so that the positioning of the edges of the chromium layer is likewise difficult to control. Yet this positioning of the edges of the opaque chromium must be carefully controlled in order to yield the desired improved resolution for the mask.

Moreover, the method taught by A. Nitayama et al. is not sufficiently versatile to make masks having arbitrary features, such as clustered line-space features or isolated apertures having relatively narrow-sized phase-shifting assistslots. Clustered line-space features, as well as apertures having phase-shifting slots, can be made in accordance with the teachings in a paper by M. D. Levenson et al. entitled "Improved Resolution in Photolithography with a Phase-Shifting Mask," published in *IEEE Transactions on Electron Devices*, Vol. ED-29, pp. 1828-1836 (1982). The technique taught therein to make such mask devices, however, required two alignment steps (two-alignment-level method), and is therefore undesirable from the standpoints of accurate alignment and decreased throughput of the mask-making procedure (typically electron beam lithography).

Isolated apertures with phase-shifting assist-slots have been taught in a paper by T. Terasawa et al. entitled "0.3 $\mu$m Optical Lithography Using Phase-Shifting Mask," published in SPIE, Vol. 1088, Optical/Laser Microlithogaphy II (1989), pp. 25-33, at FIG. 2. But that method also requires a two-level alignment and is therefore likewise undesirable.

Therefore, it would be desirable to have a more versatile and more controllable single-alignment-level method of manufacturing phase-shifting masks. More generally, it would be desirable to have a more versatile and more controllable single-alignment-level lithographic technique for achieving self-aligned features.

SUMMARY OF THE INVENTION

A single-alignment-level lithographic technique for achieving self-aligned features—as, for example, in a phase-shifting mask (reticle)—in accordance with an embodiment of the invention comprises the steps of:

(a) forming a resist layer on the surface of a first material layer, such as an opaque metal layer, located on the surface of a second material layer, such as a spun-on glass layer, located on a ma or surface of a substrate, such as quartz;

(b) bombarding first, second, and third regions of the resist layer with mutually different first, second, and third doses of radiation per unit area, respectively, the first and second regions being contiguous at a first mutual boundary, and the second and third regions being contiguous at a second mutual boundary;

(c) subjecting the resist layer to a first treatment, whereby the first region of the resist is removed, but neither the second region nor the third region thereof is removed;

(d) removing the first material layer in regions thereof underlying the original first region of the resist layer;

(e) subjecting the second and third regions of the resist layer to a second treatment, whereby the second region but not the third region of the resist layer is resistant to removal in step (f);

(f) subjecting the second and third regions of the resist layer to a third treatment, whereby the third region but not the second region of the resist layer is removed; and (g) etching the first material layer, but not the second material layer, in regions thereof underlying the original third region, but not the original second region, of the resist layer.

In accordance with another embodiment of the invention, during step (e) the third region, but not the second region, of the resist layer is made resistant to removal in step (f); during step (f) the second region, but not the third region, of the resist layer is removed; and during step (g) the first material layer, and not the second material layer, is etched in regions thereof underlying the original second region, but not the original third region, of the resist layer. In either embodiment, during the foregoing step (d) or, as an alternative, between steps (f) and (g), the second material layer is removed in regions thereof underlying the original first region of the resist—this latter alternative being preferred in cases where (dry) etching is used which can spoil the resist regions.

In this way, in all embodiments there is created a device having an edge in the first material layer and an edge in the second material layer that are aligned with respect to the second and first mutual boundaries, respectively, and hence that are aligned with respect to each other.

The remaining region of the resist may thereafter be removed, if desired. Typically, the dose per unit area received by the third (FIG. 2) or the second (FIG. 7) region is substantially zero, and the flood treatment in step (e) typically involves a flood exposure to a silicon-containing reactant (silylation) or a flood exposure to optical radiation. Moreover, the second material layer can be a top portion of the substrate itself—i.e., can be a part of the thickness of the substrate—provided that the uniformity of depth of etching of the substrate can be sufficiently well controlled across its major surface, typically within ±5 per centum. Typically, the radiation used in step (b) consists of electrons, but ions or photons can also be used.

The resulting device, a (patterned) phase-shifting mask (or other patterned device), has thus been patterned by means of but a single resist layer which has been subjected to different doses of radiation in different regions. This mask can then be used, for example, as the reticle 103 in the system 200 (FIG. 1) for patterning the photoresist layer 101 in fabricating integrated circuits by means of photolithographic techniques or for other lithographic procedures. The features (edges) of this mask are determined by the contours of the boundaries between the first, second, and third regions of the resist layer; in turn these features determine the pattern transferred to the photoresist layer 101 in the system 200.

BRIEF DESCRIPTION OF THE DRAWING(S)

This invention, together with its features, advantages, and characteristics, may be better understood from the following detailed description when read in conjunction with the drawing in which FIG. 1 is a diagram of a typical photolithography system, useful for understanding a purpose of the invention;

Only for the sake of clarity, none of the drawings is drawn to any scale.

DETAILED DESCRIPTION

Figure 1:
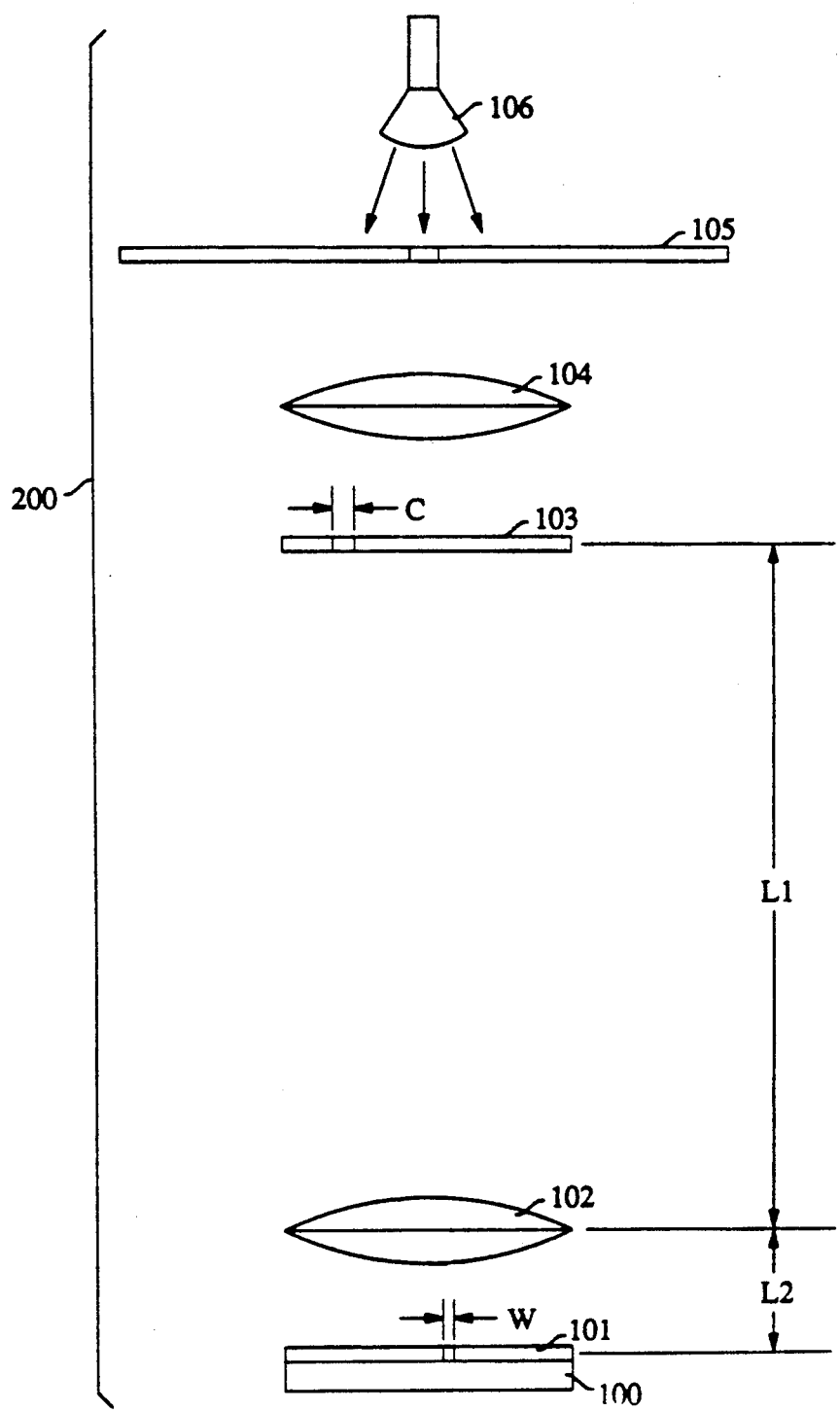
Figure 2:
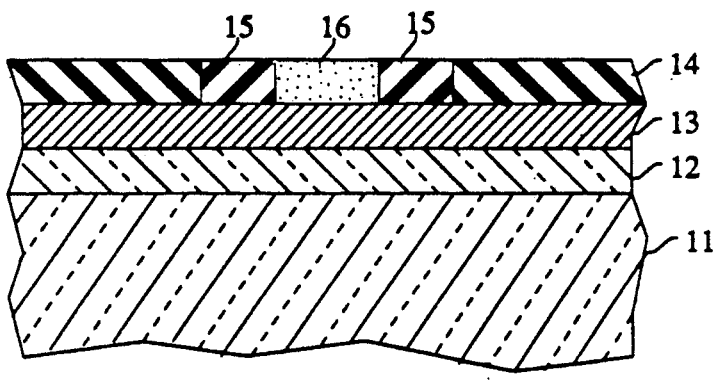
FIGS. 2-6 are side elevational views in cross section of various stages in the manufacture of a phase-shifting mask, in accordance with a specific embodiment of the invention.

Referring now to the drawings, FIG. 2 shows an early stage in the making of an illustrative portion of a desired phase-shifting mask 600 (FIG. 6) for use as the reticle 103 (FIG. 1). For the sake of definiteness it will be assumed that the feature desired in this portion of the mask is a square aperture, but it should be understood that other features can be made in accordance with the invention, such as a circular aperture or a line-space feature.

Substrate 11 is transparent, typically amorphous quartz. Layer 12 is a transparent phase-shifting layer, e.g., spun-on glass, located on a major surface of the quartz substrate 11 itself. For phase-shifting by $\pi$ radian, the thickness of the layer 12 is everywhere equal to $\lambda/2(n-1)$, where $\lambda$ is the vacuum wavelength to be used in the system 200 (FIG. 1) and n is the refractive index of the material in layer 12. Note that in case the source 106 (FIG. 1) emits many different (unwanted) wavelengths, a suitable filter(s) can be inserted into the system 200, to ensure essentially monochromatic radiation, as known in the art. Layer 13 is an opaque layer, typically chromium having a uniform thickness of about 0.1 µm, which has been deposited on a top major surface of the transparent layer 12. Note that if the layer 13 is electrically conductive, as is chromium, advantageously it is grounded during the electron bombardment of the overlying resist.

Layer 14 is a positive tone electron beam resist, typically a mixture of a polymer such as polycresolfortnaldehyde and a radiation-sensitive compound such as substituted 1,2 napthoquinone diazide. This layer 14 has a uniform thickness, typically of about 0.5 µm, and it has been bombarded with electrons in regions 15 and 16 thereof, but not elsewhere. The dose of electrons received in region 15 is made different from that in region 16, as discussed further below. The contour of the boundaries of these regions, as viewed from above, are in accordance with the ultimately desired feature in the mask 600 thereat. Thus, for a square aperture feature, the edges of region 16 form a square, and the edges of the region 15 form a square-ring. For a line-space feature, the edges of the regions 15 and 16 form parallel lines.

The doses of electrons received by regions 15 and 16 of the resist layer are selected such that when the resist layer is developed with a suitable developing process, region 16 of the resist layer is removed but region 15 thereof remains intact (as does region 14). For example, a developer composed of tetramethyl-ammonium hydroxide solution in water (normality 0.3 N) can be used. Thus, typically the dose in region 16 is lower than that in region 15 but is nonetheless sufficient in region 16 to enable the developing process to remove the resist therein, as known in the art. The dose in region 14 is zero. Thus the resist layer is patterned with an aperture 21 (FIG. 3) in the resist material where the low dose was received.

Using the thus patterned resist layer 14 as a protective mask in conjunction with etching, the opaque chromium layer 13 and the spun-on glass layer 12 are subjected to etching, whereby the aperture 21 penetrates down through the chromium and spun-on glass layers to the top surface of the quarter layer 11. For example, to etch selectively the chromium layer 13, a wet etchant such as ceric ammonium nitrate or a dry etching with a chlorinated gaseous plasma can be used; and to etch the spun-on glass layer 12 a mixture of 10:1 HF and 40% NH₃F, in a volume ratio of 3 to 50, or a dry etching with a fluorinated gaseous plasma, can be used.

Figure 4:
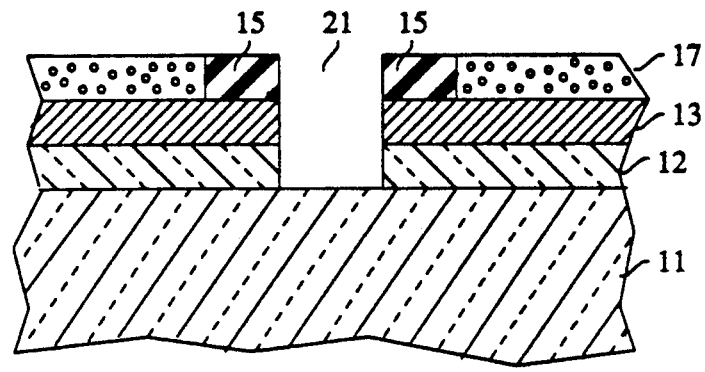

Next (FIG. 4), the resist layer is subjected to a process which renders region 17, but not region 15, immune from removal during a subsequent (FIG. 5) resist removal step. For example, the resist is treated with silicon-containing species, such as an organic silicon-containing agent (such as hexamethyldisilazane), whereby region 14 (or at least a top portion thereof) forms a silylated region 17; but region 15 does not become silylated, because the high dose of electrons to which it was originally subjected (FIG. 2) produces cross-linking of the resist material, whereby it becomes impervious to silicon and hence resistant against silylation.

Figure 5:
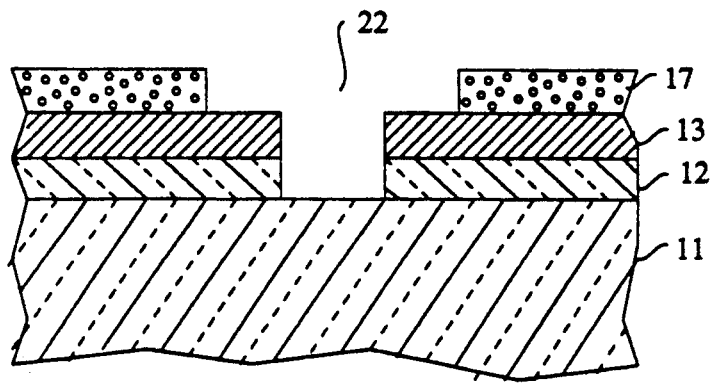

As a consequence of the silylation, the resist in region 17, formerly region 14, but not in region 15 becomes resistant against a second etching step, such as a treatment with an oxygen plasma. As a result of such second etching step, an aperture 22 is formed in the resist layer 17. Consequently, after such second etching step, the resist in region 15, but not in region 17, is removed (FIG. 5). Then, using the resist remaining in region 17 as a protective mask against etching, an etching process is used of the kind which removes the portion of the chromium layer 13, but not the spun-on glass layer 12, underlying the aperture 22. Again, a wet etchant such as ceric ammonium nitrate can be used, for example. Thus, an aperture 23 is formed having wider lateral dimension in the chromium layer 13 than in the spun-on glass layer 12. Finally, if desired, the remaining resist layer 17 can be removed, as known in the art, to form the desired phase-shifting mask or reticle 600 (FIG. 6).

Prior to the silylation, a flood exposure to mid or near ultraviolet radiation can be performed, in order to enhance the diffusion and reaction of the silylation agent in the (uncrosslinked) region 14.

Instead of using a silicon-containing agent to produce silylation of the resist, a tin-containing agent can be used to diffuse into and react with the resist.

Figure 3:
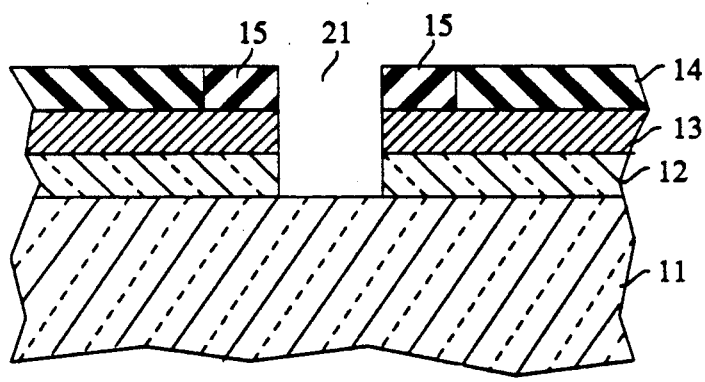
Figure 6:
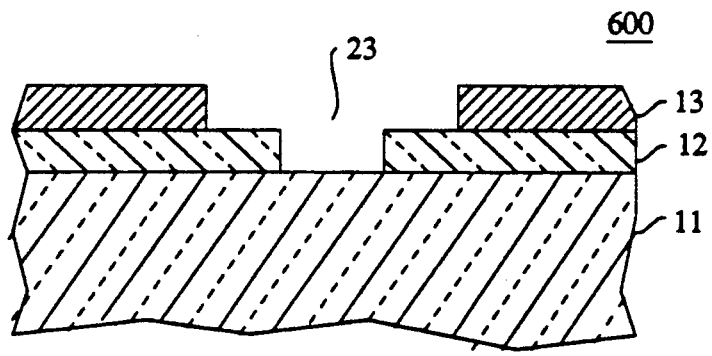

Note that if etching the layer 12, in going from the situation shown in FIG. 2 to that shown in FIG. 3, would spoil the regions 14 or 15 of the resist layer—as may be the case especially where dry plasma etching of the layer 12 is used—then the layer 12 is not etched until after the situation shown in FIG. 5 and before the situation shown in FIG. 6 is attained; that is, the layer 12 is etched using the layer 13 alone as a mask.

Figure 7:
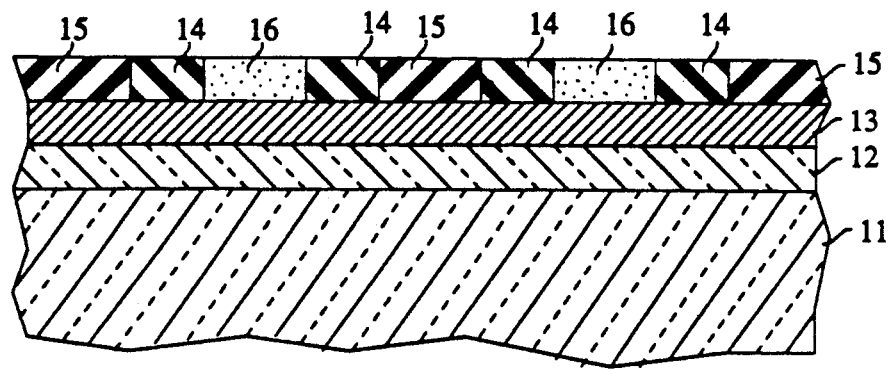
FIGS. 7-8 are side elevational views in cross section of various stages in the manufacture of a phase-shifting mask, in accordance with another specific embodiment of the invention.
Figure 8:
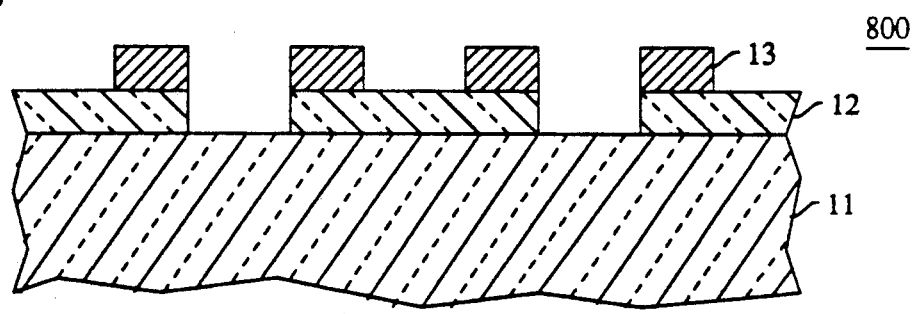

In case the desired mask feature is clustered line-spaces, the procedures indicated in FIGS. 7-8 can be used. Referring now to FIG. 7, instead of bombarding the surface of the resist layer in accordance with the pattern shown in FIG. 2, the bombardment is carried out in accordance with FIG. 7. Again regions 14 represent no dose of electron bombardment, and the dose in region 16 is typically lower than that in region 15. It should be understood that all these regions extend perpendicular to the plane of the drawing as elongated regions bounded by parallel lines. Then by using the same steps described above in connection with FIGS. 2-6, a mask 800 (FIG. 8) is formed having the desired alternating line-space phase-shifting features, for use as a reticle 103 (FIG. 1).

Figure 9:
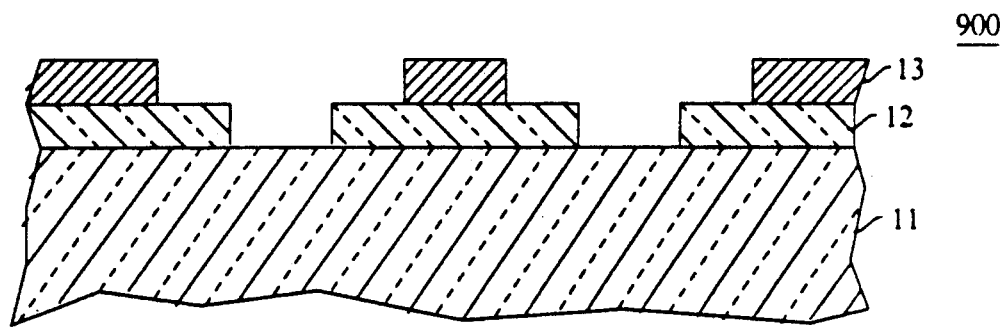
FIG. 9 is a side elevational view in cross section of a phase-shifting mask manufactured in accordance with yet another specific embodiment of the invention.

Instead of silylation, an optical flood exposure can be used. More specifically, after the mask being formed has been brought into the condition shown in FIG. 7, and after the region 16 together with those portions of the chromium layer 13 and the spun-on glass layer 12 underlying it have thereafter all been removed, the entire top surface of the remaining structure is exposed to optical radiation, typically mid or near ultraviolet, whereby the region 14 of the resist layer becomes susceptible to removal by a second development step, such as a second wet development which may be the same that was used earlier to remove region 16. Thus, after this second development step, the resulting pattern of removed and unremoved regions 14 and 15 of the resist layer will be complementary to that obtained by the above-described silylation procedure. In particular, region 14 will be removed, and region 15 will remain. Using region 15 as a protective layer against etching the underlying chromium layer 13, a subsequent etching of the chromium layer 13 will therefore result in the mask 900 (FIG. 9).

Instead of the optical flood exposure, electron beam or ion beam flood exposure can be used. The silylation procedure, resulting in mask 800, is preferred for mostly opaque masks (i.e., most of the mask area being opaque)

whereas the optical flood procedure, resulting in mask 900, is preferred for mostly transparent masks.

It should be noted that the layer 12 in the embodiments shown in FIGS. 2–6 and 7–9 need not be present in case the etch rate of the amorphous quartz or other transparent substrate can be sufficiently controlled—typically within ±5% across the entire major surface of the substrate—so that the depth of etch penetration into the substrate satisfies the required phase-shifting within desirable diffraction limits.

Although the invention has been described in detail in terms of a specific embodiment, various modifications can be made without departing from the scope of the invention. For example, instead of a feature in the form of a square aperture, a circular aperture can be formed. Also, an isolated line feature can be attained by making all the boundaries between regions 14, 15, and 16 (FIG. 2) in the form of parallel lines (when viewed from above). Clustered line-space features can be obtained by arranging regions 14, 15, and 16 in accordance with FIG. 7.

Instead of using geometrically selective electron bombardment to delineate the regions 14, 15, and 16, other kinds of bombardments can be used, such as ions and/or photons, to which the resist is sensitive. The resist itself can be a negative tone resist, instead of a positive tone resist, with suitable rearrangement of the layout of regions 14, 15, and 16, if need be. Instead of chromium for the opaque layer 13, other materials having sufficient opacity can be used such as molybdenum silicide. Instead of spun-on glass for the phase-shifting layer 12, other materials can be used that can be differentially (selectively) etched with respect to the underlying (quartz) substrate, such as either silicon dioxide or silicon nitride, which has been chemically vapor deposited on the (quartz) substrate. Moreover, thicknesses of the phase-shifting layer corresponding to phase shifts other than $\pi$ radians can also be used, in accordance with diffraction principles. Finally, the relative dimensions of regions 15 and 16 can advantageously be chosen in accordance with the criteria that are disclosed in the pending patent application entitled "Phase-Shifting Lithographic Masks with Improved Resolution" Ser. No. 07/622,680 filed on Dec. 5, 1990.

We claim:

1. A single alignment level lithographic technique for making a phase-shifting mask consisting essentially of the steps of:
   (a) forming a resist layer on the surface of a first material layer located on the surface of a second material layer located on the surface of a substrate, the first material layer being opaque and the second material layer being transparent with respect to a prescribed optical radiation;
   (b) subjecting first, second, and third regions of the resist layer with mutually different first, second, and third doses of a resist-modifying radiation per unit area, respectively, the first and second regions having a first common boundary, and the second and third regions having a second common boundary;
   (c) subjecting the resist layer to a first development procedure, whereby the first region of the resist is removed but neither the second region nor the third region thereof is removed;
   (d) removing the first material layer, but not the second material layer, in a region thereof underlying the original first region of the resist layer;
   (e) subjecting the second and third regions of the resist layer to a treatment, whereby the second region, but not the third region, of the resist layer is resistant to removal in step (f);
   (f) subjecting the second and third regions of the resist layer to a second development procedure, whereby the second region, but not the third region, of the resist layer is removed;
   (g) removing the second material layer in a region thereof underlying the original first region of the resist layer; and
   (h) etching the first material layer, but not the second material layer, in regions thereof underlying the original second region, but not the original third region, of the resist layer,
   wherein the order of sequence of performance of the steps is (a), (b), (c), (d), (e), (f), (g), (h),
   whereby there is created an edge in the first material layer and an edge in the second material layer that are respectively aligned with respect to the second and first common boundaries.

2. A single-alignment level lithographic technique for making a phase-shifting mask consisting essentially of the steps of:
   (a) forming a resist layer on the surface of a first material layer located on the surface of a second material layer located on the surface of a substrate, the first material being opaque and the second material layer being transparent with respect to prescribed optical radiation;
   (b) subjecting first, second, and third regions of the resist layer with mutually different first, second, and third doses of resist-modifying radiation per unit area, respectively, the first and second regions having a first common boundary, and the second and third regions having a second common boundary;
   (c) developing the resist layer, whereby the first region of the resist if removed but neither the second region nor the third region thereof is removed;
   (d) removing the first material layer, but not the second material layer, in a region thereof underlying the original first region of the resist layer;
   (e) subjecting the second and third regions of the resist layer to a treatment, whereby the second region, but not the third region, of the resist layer is resistant to removal in step (f);
   (f) developing the resist layer, whereby the third region, but not the second region, of the resist layer is removed;
   (g) removing the second material layer in a region thereof underlying the original first region of the resist layer; and
   (h) etching the first material layer, but not the second material layer, in regions thereof underlying the original third region, but not the original second region of the resist layer,
   wherein the order of sequence of performance of the steps is (a), (b), (c), (d), (e), (f), (g), (h),
   whereby there is created an edge in the first material layer and an edge in the second material layer that are respectively aligned with respect to the second and first common boundaries.

3. The technique of claim 1 or 2 in which the second material layer is part of, and has the same chemical composition as that of, the substrate.

4. The technique of claim 1 or 2 in which the radiation recited in step (b) is electrons.

5. The technique of claim 1 or 2 in which the first material is a metal.

6. The technique of claim 1 or 2 in which step (e) includes a silylation step.

7. The technique of claim 1 or 2 in which step (e) includes an optical flooding step.

8. The technique of claim 1 or 2 in which during step (b) the dose of radiation received by the third region of the resist layer is essentially zero.

9. The technique of claim 1 or 2 in which during step (b) the dose or radiation received by the second region of the resist layer is essentially zero.

10. A photolithographic method including the steps of:
(a) forming a phase-shifting mask in accordance with the steps recited in claim 9;
(b) directing the prescribed optical radiation onto the mask, and focusing the radiation propagating through the mask onto a photoresist layer located on a major surface of a wafer, or on a layer of material located on a major surface of a wafer;
(c) developing the photoresist layer, whereby an edge feature is formed therein; and
(d) defining a feature at the major surface of the wafer or in the layer of material, respectively, in accordance with the edge feature in the photoresist layer.

11. A method of making a phase-shifting mask device, for use in a photolithographic procedure, comprising the steps recited in claims 1 or 2 in which the first material layer is opaque while the substrate and the second material layers are transparent with respect to optical radiation to be used in the photolithographic procedure.

12. The method of claim 11 in which the second material layer is part of the thickness of the substrate.

13. A photolithographic method including the steps of:
(a) forming a phase-shifting mask in accordance with the steps recited in claim 12;
(b) directing the precribed optical radiation onto the mask, and focusing the radiation propagating through the mask onto a photoresist layer located on a major surface of a wafer, or on a layer of material located on a major surface of a wafer;
(c) developing the photoresist layer, whereby an edge feature is formed therein; and
(d) defining a feature at the major surface of the wafer or in the layer of material, respectively, in accordance with the edge feature in the photoresist layer.

14. The method of claim 11 in which step (e) includes an optical flooding step.

15. The method of claim 14 in which during step (b) the radiation is electrons and in which the dose of radiation received by the second region of the resist layer is essentially zero.

16. The method of claim 11 in which step (e) includes a silylation step.

17. The method of claim 16 in which during step (b) the radiation is electrons and the dose of electrons received by the third region of the resist layer is essentially zero.

18. The method of claim 17 in which the first and second regions have square or circular contours, whereby after the etching step an aperture bounded by the edge in the opaque layer is formed in the opaque layer.

19. A photolithographic method including the steps of:
(a) forming a phase-shifting mask in accordance with the steps recited in claim 17;
(b) directing the precribed optical radiation onto the mask, and focusing the optical radiation propagating through the mask onto a photoresist layer located on a major surface of a wafer or on a layer of material located on a major surface of a wafer, respectively;
(c) developing the photoresist layer, whereby an edge feature is formed therein; and
(d) defining a feature at the major surface of the wafer or in the layer of material, respectively, in accordance with the edge feature in the photoresist layer.

20. A photolithographic method of making semiconductor integrated circuits including the steps of:
(a) forming a phase-shifting mask in accordance with the steps recited in claim 11;
(b) directing the precribed optical radiation onto the mask, and focusing the radiation propagating through the mask onto a photoresist layer located on a major surface of a semiconductor wafer or located on a layer of material located on a major surface of a semiconductor wafer;
(c) developing the photoresist layer, whereby an edge feature is created therein; and
(d) defining a feature at the major surface of the semiconductor wafer or in the layer of material, respectively, in accordance with the edge feature in the photoresist layer.

* * * * *

UNITED STATES PATENT AND TRADEMARK OFFICE
CERTIFICATE OF CORRECTION

PATENT NO. : 5,275,896
DATED : January 4, 1994
INVENTOR(S) : J. G. Garofalo, R. L. Kostelak, Jr., C. Pierrat, and S. Vaidya It is certified that error appears in the above-indentified patent and that said Letters Patent is hereby corrected as shown below:

Col. 8, line 2, "second" should read --third--; Col. 8, line 3, "third" should read --second--; Col. 8, line 39 "if" should read --is--. Col. 9, line 11, "or" should read --of--; Col. 10, line 26 "a" (second occurrence) should read --the--.

Signed and Sealed this

Tenth Day of October, 1995

*Attest:*

BRUCE LEHMAN

*Attesting Officer*  Commissioner of Patents and Trademarks